United States Patent
Basu et al.

(10) Patent No.: US 9,070,770 B2
(45) Date of Patent: Jun. 30, 2015

(54) LOW INTERFACIAL DEFECT FIELD EFFECT TRANSISTOR

(71) Applicant: International Business Machines Corporation, Armonk, NY (US)

(72) Inventors: Anirban Basu, Elmsford, NY (US); Guy Cohen, Mohegan Lake, NY (US); Amlan Majumdar, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/010,585

(22) Filed: Aug. 27, 2013

(65) Prior Publication Data
US 2015/0061013 A1 Mar. 5, 2015

(51) Int. Cl.
*H01L 29/78* (2006.01)
*H01L 29/66* (2006.01)

(52) U.S. Cl.
CPC ........ *H01L 29/785* (2013.01); *H01L 29/66795* (2013.01)

(58) Field of Classification Search
CPC ........................ H01L 29/785; H01L 29/66795
USPC ....................................................... 257/288
See application file for complete search history.

(56) References Cited

U.S. PATENT DOCUMENTS

| | | | |
|---|---|---|---|
| 5,952,672 A | 9/1999 | Kikkawa | |
| 7,825,481 B2 | 11/2010 | Chau et al. | |
| 8,361,869 B2 * | 1/2013 | Zhou et al. | 438/289 |
| 2005/0017377 A1 * | 1/2005 | Joshi et al. | 257/903 |
| 2008/0191242 A1 * | 8/2008 | Detlev | 257/190 |
| 2008/0224183 A1 * | 9/2008 | Nawaz | 257/279 |
| 2009/0294864 A1 | 12/2009 | Suk et al. | |

(Continued)

FOREIGN PATENT DOCUMENTS

| | | |
|---|---|---|
| KR | 10-1213702 B1 | 12/2012 |
| WO | 2012159329 A1 | 11/2012 |

OTHER PUBLICATIONS

Gong, X. et al., "Source/Drain Engineering for In0.7Ga0.3As N-Channel Metal-Oxide-Semiconductor Field-Effect Transistors: Raised Source/Drain with In situ Doping for Series Resistance Reduction" Japanese Journal of Applied Physics (Apr. 2011) pp. 04DF01-1-04DF01-4, vol. 50, Issue 4.
Tang, C.W. et al., "Hetero-epitaxy of III-V compounds lattice-matched to InP by MOCVD for device applications" IEEE International Conference on Indium Phosphide & Related Materials (May 10-14, 2009) pp. 136-139.
Zhao, H. et al., "Factors enhancing In0.7Ga0.3As MOSFETs and tunneling FETs device performance" Device Research Conference (DRC) (Jun. 21-23, 2010) pp. 63-64.
Park, D., "3 Dimensional GAA Transitors: twin silicon nanowire MOSFET and multi-bridge-channel MOSFET" 2006 IEEE International SOI Conference Proceedings (Oct. 2-5, 2006) pp. 131-134.
Office Action dated Nov. 28, 2014 received in U.S. Appl. No. 14/010,589.
US Office Action dated Mar. 20, 2015 received in U.S. Appl. No. 14/010,589.

*Primary Examiner* — Roy Potter
*Assistant Examiner* — Paul Patton
(74) *Attorney, Agent, or Firm* — Scully, Scott, Murphy & Presser, P.C.; Louis J. Percello, Esq.

(57) ABSTRACT

A disposable gate structure straddling a semiconductor fin is formed. A source region and a drain region are formed employing the disposable gate structure as an implantation mask. A planarization dielectric layer is formed such that a top surface of the planarization dielectric layer is coplanar with the disposable gate structure. A gate cavity is formed by removing the disposable gate structure. An epitaxial cap layer is deposited on physically exposed semiconductor surfaces of the semiconductor fin by selective epitaxy. A gate dielectric layer is formed on the epitaxial cap layer, and a gate electrode can be formed by filling the gate cavity. The epitaxial cap layer can include a material that reduces the density of interfacial defects at an interface with the gate dielectric layer.

15 Claims, 11 Drawing Sheets

(56) References Cited

U.S. PATENT DOCUMENTS

| | | |
|---|---|---|
| 2010/0252801 A1 | 10/2010 | Sekaric et al. |
| 2011/0024794 A1 | 2/2011 | Ko et al. |
| 2011/0133280 A1 | 6/2011 | Bangsaruntip et al. |
| 2012/0302014 A1 | 11/2012 | Huang et al. |
| 2012/0329217 A1 | 12/2012 | Bangsaruntip et al. |
| 2013/0001591 A1 | 1/2013 | Wu et al. |
| 2013/0005103 A1 | 1/2013 | Liu et al. |
| 2013/0089958 A1 | 4/2013 | Yeh et al. |

* cited by examiner

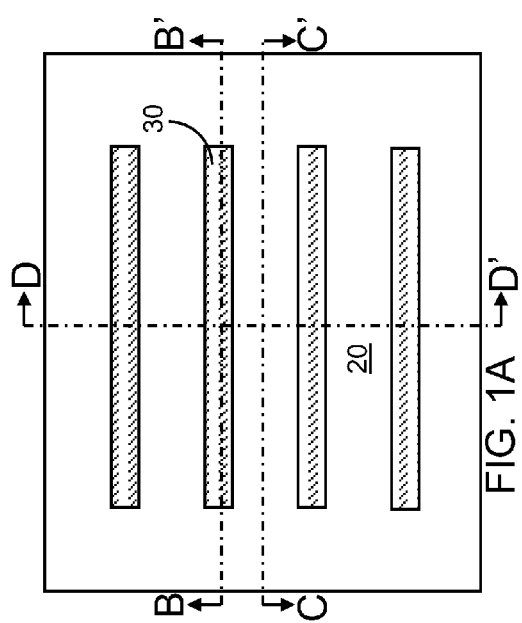
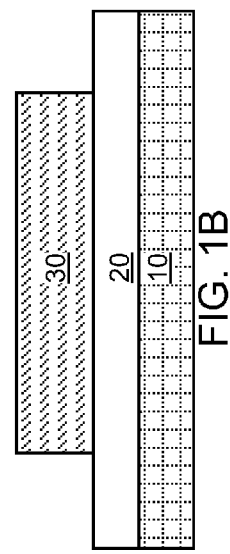
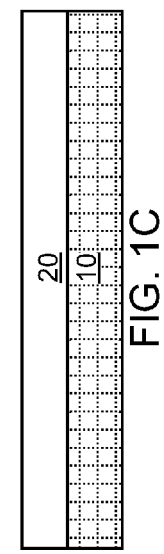
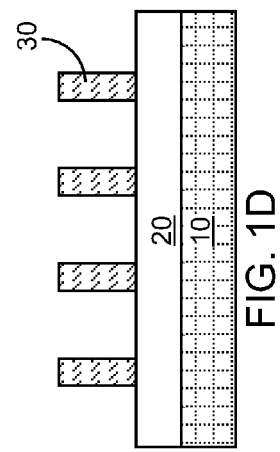
FIG. 1A
FIG. 1B
FIG. 1C
FIG. 1D

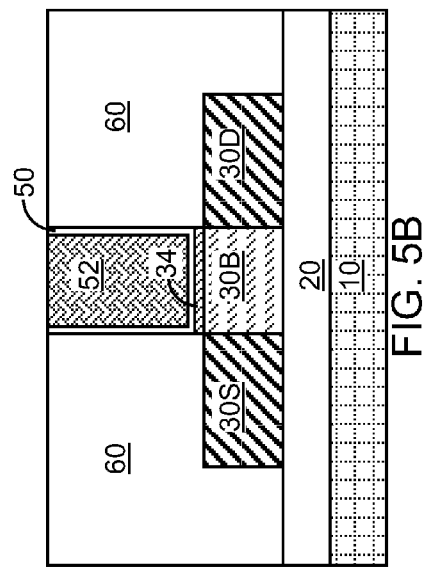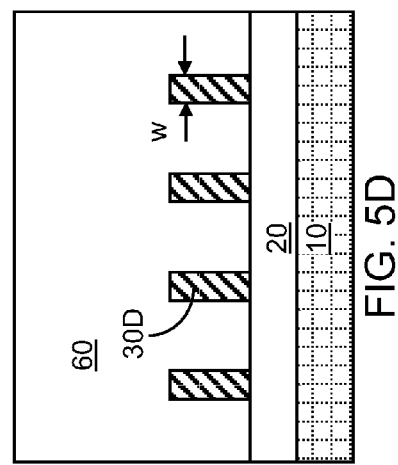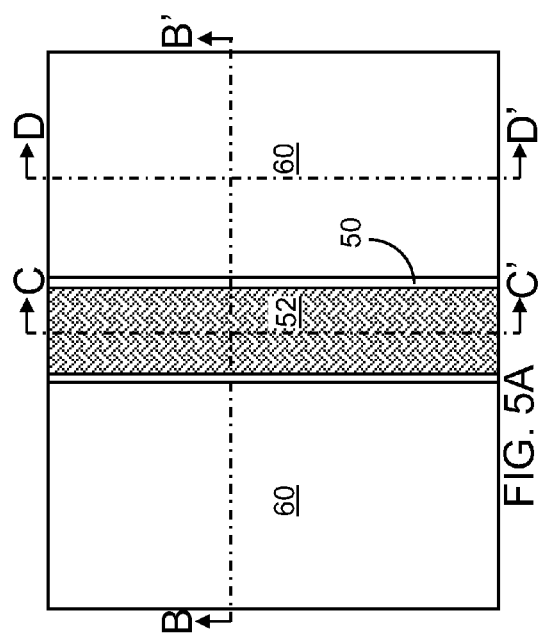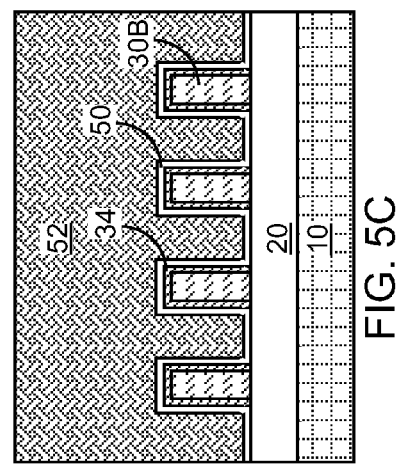

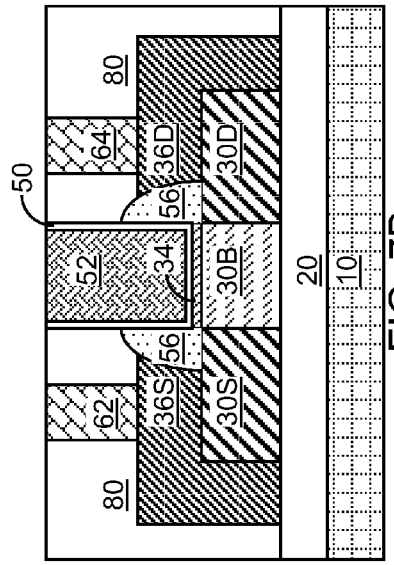
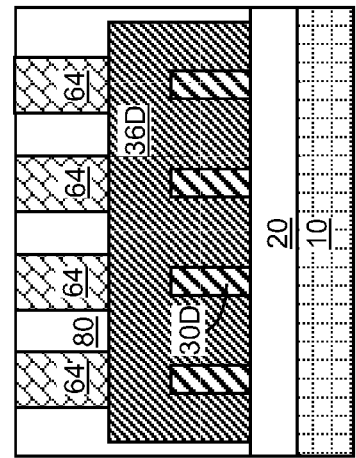
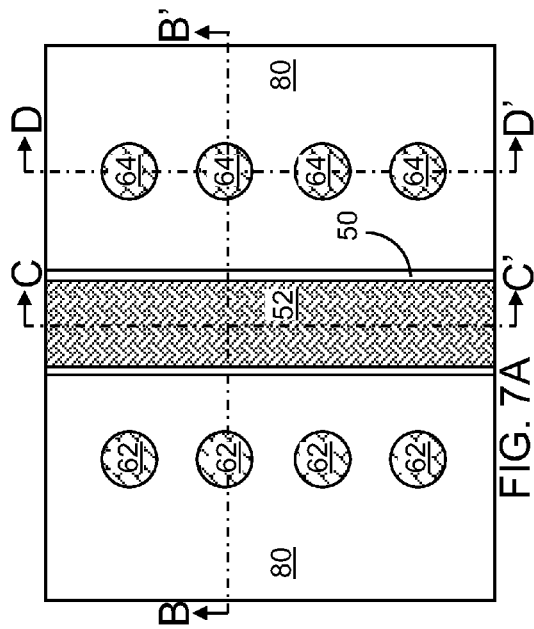
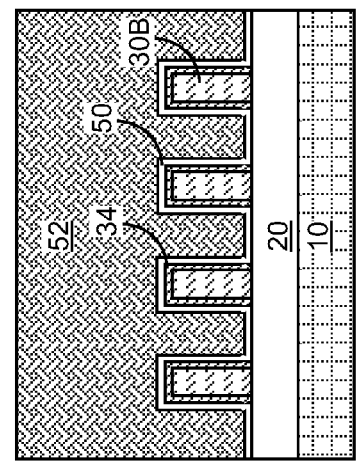

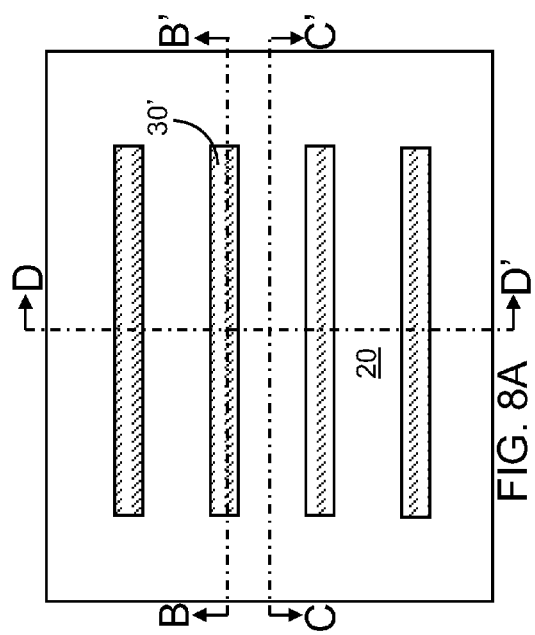
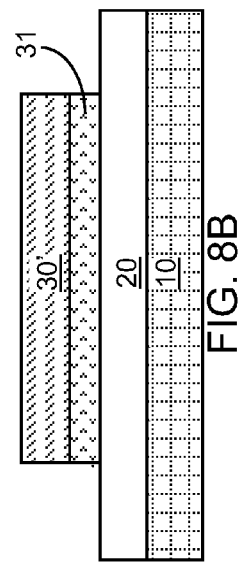
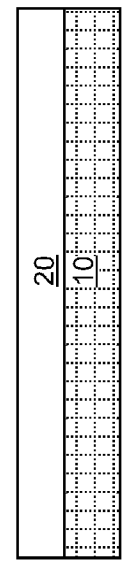
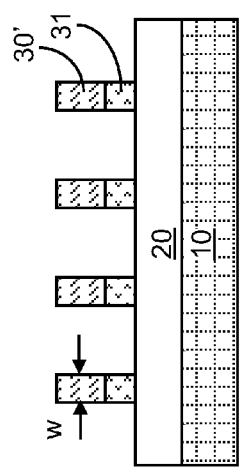

LOW INTERFACIAL DEFECT FIELD EFFECT TRANSISTOR

RELATED APPLICATIONS

The present application is related to copending U.S. patent application Ser. No. 14/010,585, the entire contents of which are incorporated herein by reference.

BACKGROUND

The present disclosure relates to a semiconductor structure, and particularly to field effect transistors employing an epitaxially grown cap layer and a method of manufacturing the same.

As field effect transistors are scaled down, the short channel effect and the increase in the extension resistance that accompany the scaling adversely impact performance of the field effect transistors. These problems are especially difficult to solve in fin field effect transistors employing a compound semiconductor material owing to the difficulty of forming high quality contacts and a severe constraint on thermal budget of processing relative to field effect transistors employing elemental semiconductor materials.

SUMMARY

A disposable gate structure straddling a semiconductor fin is formed. A source region and a drain region are formed employing the disposable gate structure as an implantation mask. A planarization dielectric layer is formed such that a top surface of the planarization dielectric layer is coplanar with the disposable gate structure. A gate cavity is formed by removing the disposable gate structure. An epitaxial cap layer is deposited on physically exposed semiconductor surfaces of the semiconductor fin by selective epitaxy. A gate dielectric layer is formed on the epitaxial cap layer, and a gate electrode can be formed by filling the gate cavity. The epitaxial cap layer can include a material that reduces the density of interfacial defects at an interface with the gate dielectric layer.

According to an aspect of the present disclosure, a semiconductor structure includes a semiconductor fin. The semiconductor fin contains a first semiconductor material and is located on a substrate. The semiconductor fin includes a source region, a drain region, and a body region laterally contacting the source region and the drain region. The semiconductor structure further contains a cap layer. The cap layer includes a second semiconductor material and contacts a top surface and a pair of sidewalls of the body region. A horizontal interface between the semiconductor fin and the cap layer is within a same horizontal plane as a top surface of the semiconductor fin.

According to another aspect of the present disclosure, a method of forming a semiconductor structure is provided. A semiconductor fin including a first semiconductor material is formed on a substrate. A disposable gate structure straddling the semiconductor fin is formed. A planarization dielectric layer is formed over the semiconductor fin. A top surface of the planarization dielectric layer is coplanar with a top surface of the disposable gate structure. A gate cavity is formed by removing the disposable gate structure. A cap layer is formed directly on physically exposed surfaces of the semiconductor fin within the gate cavity. A gate dielectric layer and a gate electrode are formed within the gate cavity.

BRIEF DESCRIPTION OF SEVERAL VIEWS OF THE DRAWINGS

FIG. 1A is a top-down view of a first exemplary semiconductor structure after formation of a plurality of semiconductor fins according to a first embodiment of the present disclosure.

FIG. 1B is a vertical cross-sectional view of the first exemplary semiconductor structure along the vertical plane B-B' of FIG. 1A.

FIG. 1C is a vertical cross-sectional view of the first exemplary semiconductor structure along the vertical plane C-C' of FIG. 1A.

FIG. 1D is a vertical cross-sectional view of the first exemplary semiconductor structure along the vertical plane D-D' of FIG. 1A.

FIG. 5A is a top-down view of the first exemplary semiconductor structure after formation of a gate dielectric layer and a gate electrode according to the first embodiment of the present disclosure.

FIG. 5B is a vertical cross-sectional view of the first exemplary semiconductor structure along the vertical plane B-B' of FIG. 5A.

FIG. 5C is a vertical cross-sectional view of the first exemplary semiconductor structure along the vertical plane C-C' of FIG. 5A.

FIG. 5D is a vertical cross-sectional view of the first exemplary semiconductor structure along the vertical plane D-D' of FIG. 5A.

FIG. 7A is a top-down view of a variation of the first exemplary semiconductor structure after formation of a contact level dielectric layer and contact via structures according to the first embodiment of the present disclosure.

FIG. 7B is a vertical cross-sectional view of the first exemplary semiconductor structure along the vertical plane B-B' of FIG. 7A.

FIG. 7C is a vertical cross-sectional view of the first exemplary semiconductor structure along the vertical plane C-C' of FIG. 7A.

FIG. 7D is a vertical cross-sectional view of the first exemplary semiconductor structure along the vertical plane D-D' of FIG. 7A.

FIG. 8A is a top-down view of a second exemplary semiconductor structure after formation a plurality of semiconductor fins including vertical stacks of a buffer semiconductor material portion and a first semiconductor material portion according to a second embodiment of the present disclosure.

FIG. 8B is a vertical cross-sectional view of the second exemplary semiconductor structure along the vertical plane B-B' of FIG. 8A.

FIG. 8C is a vertical cross-sectional view of the second exemplary semiconductor structure along the vertical plane C-C' of FIG. 8A.

FIG. 8D is a vertical cross-sectional view of the second exemplary semiconductor structure along the vertical plane D-D' of FIG. 8A.

DETAILED DESCRIPTION

Figure 2B:
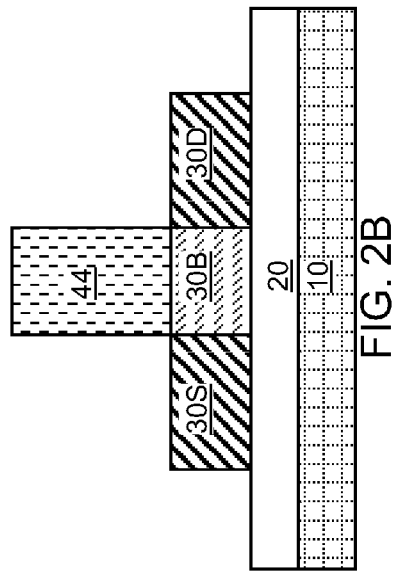
FIG. 2B is a vertical cross-sectional view of the first exemplary semiconductor structure along the vertical plane B-B' of FIG. 2A.
Figure 2D:
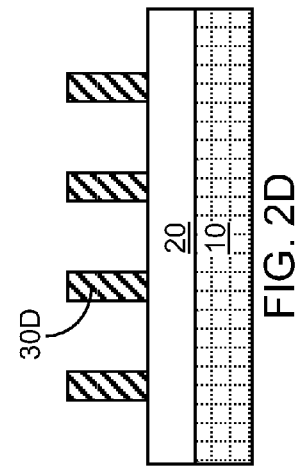
FIG. 2D is a vertical cross-sectional view of the first exemplary semiconductor structure along the vertical plane D-D' of FIG. 2A.
Figure 2A:
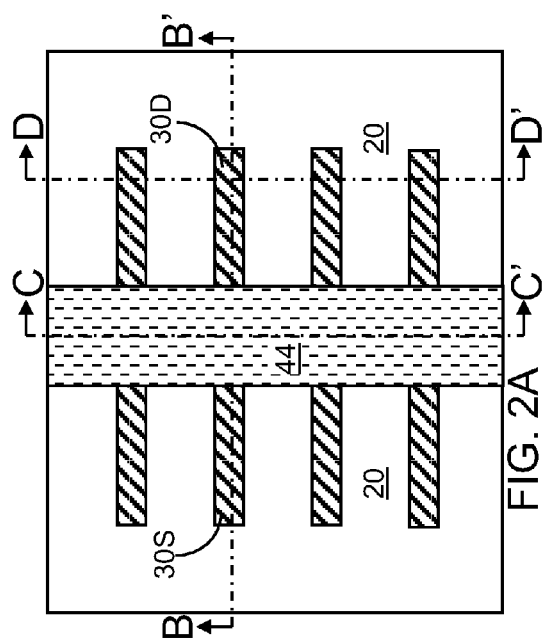
FIG. 2A is a top-down view of the first exemplary semiconductor structure after formation of a disposable gate structure according to the first embodiment of the present disclosure.
Figure 2C:
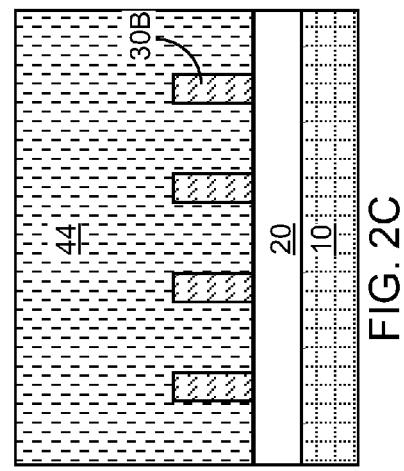
FIG. 2C is a vertical cross-sectional view of the first exemplary semiconductor structure along the vertical plane C-C' of FIG. 2A.
Figure 3A:
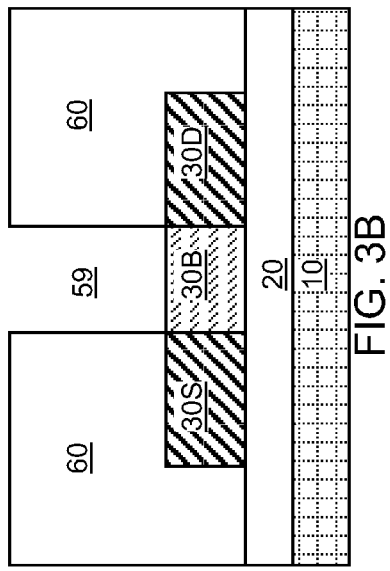
FIG. 3A is a top-down view of the first exemplary semiconductor structure after formation of a planarization dielectric layer and subsequent removal of the disposable gate structure to form a gate cavity according to the first embodiment of the present disclosure.
Figure 3B:
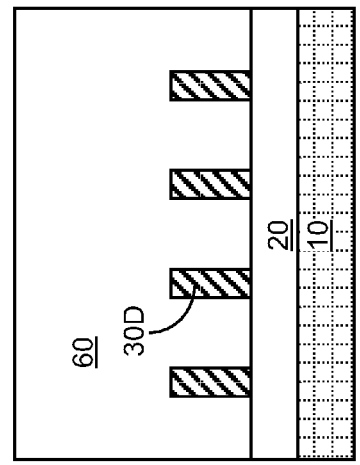
FIG. 3B is a vertical cross-sectional view of the first exemplary semiconductor structure along the vertical plane B-B' of FIG. 3A.
Figure 3C:
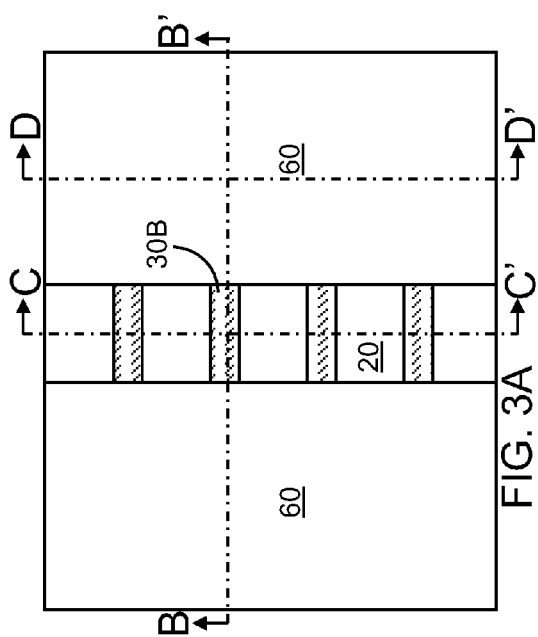
FIG. 3C is a vertical cross-sectional view of the first exemplary semiconductor structure along the vertical plane C-C' of FIG. 3A.
Figure 3D:
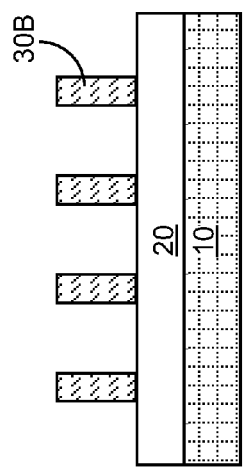
FIG. 3D is a vertical cross-sectional view of the first exemplary semiconductor structure along the vertical plane D-D' of FIG. 3A.
Figure 4A:
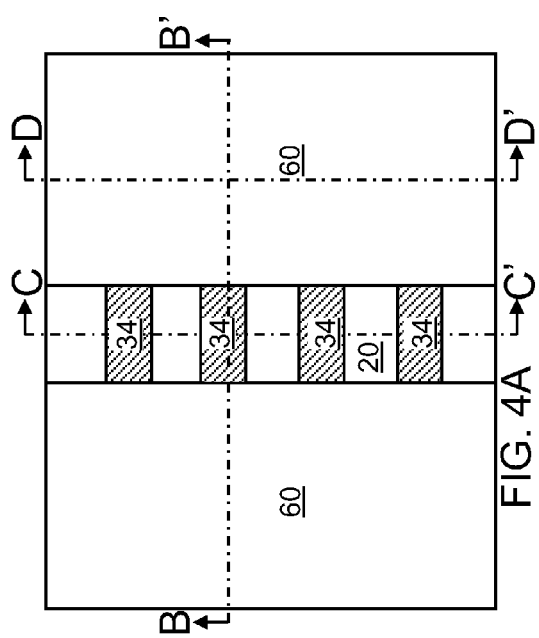
FIG. 4A is a top-down view of the first exemplary semiconductor structure after formation of cap layers by selective deposition of a second semiconductor material according to the first embodiment of the present disclosure.
Figure 4B:
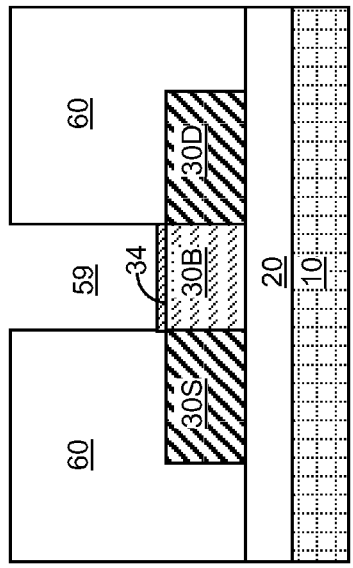
FIG. 4B is a vertical cross-sectional view of the first exemplary semiconductor structure along the vertical plane B-B' of FIG. 4A.
Figure 4C:
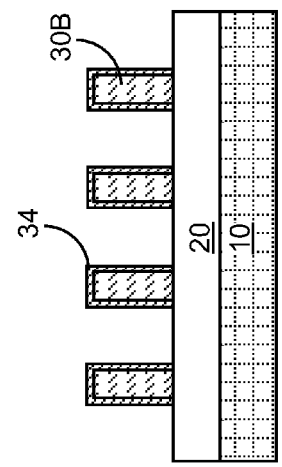
FIG. 4C is a vertical cross-sectional view of the first exemplary semiconductor structure along the vertical plane C-C' of FIG. 4A.
Figure 4D:
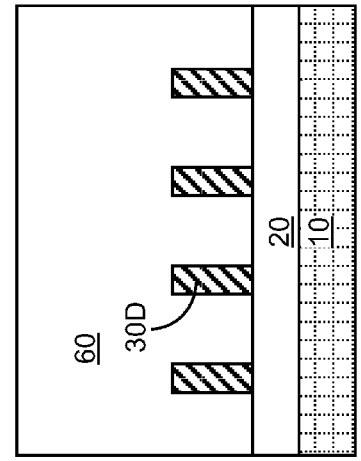
FIG. 4D is a vertical cross-sectional view of the first exemplary semiconductor structure along the vertical plane D-D' of FIG. 4A.
Figure 6A:
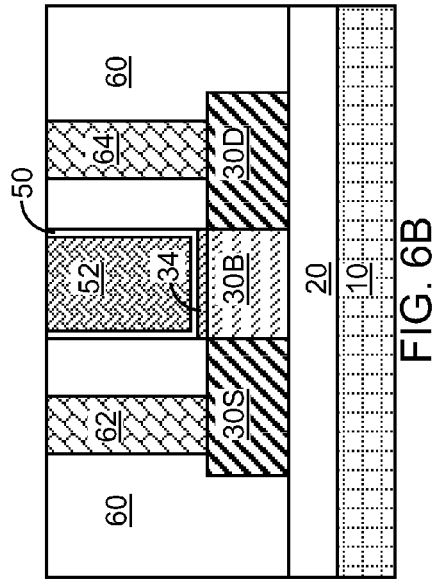
FIG. 6A is a top-down view of the first exemplary semiconductor structure after formation of contact via structures according to the first embodiment of the present disclosure.
Figure 6B:
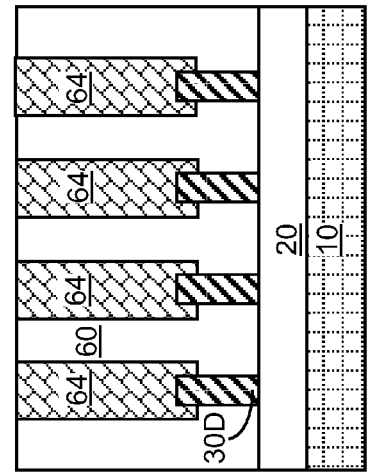
FIG. 6B is a vertical cross-sectional view of the first exemplary semiconductor structure along the vertical plane B-B' of FIG. 6A.
Figure 6C:
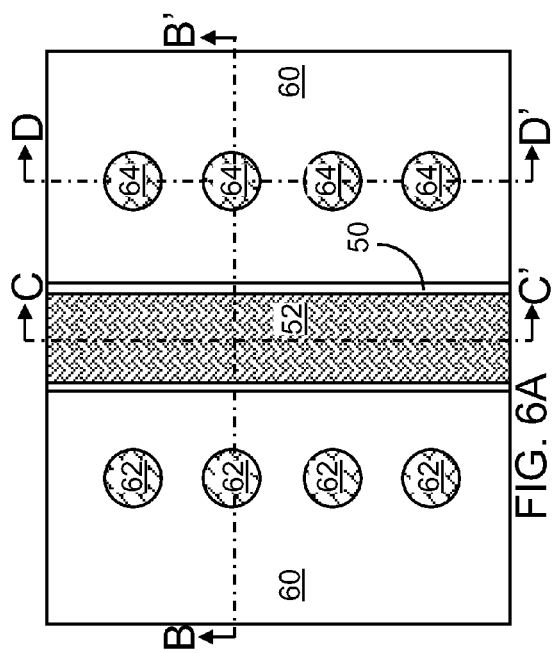
FIG. 6C is a vertical cross-sectional view of the first exemplary semiconductor structure along the vertical plane C-C' of FIG. 6A.
Figure 6D:
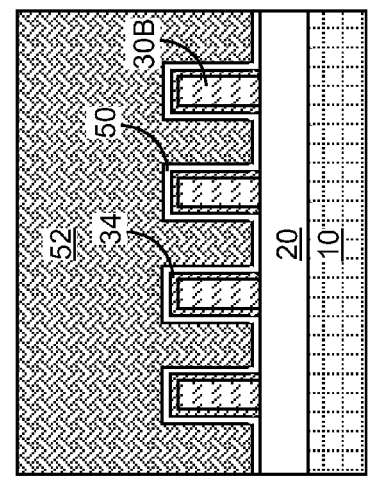
FIG. 6D is a vertical cross-sectional view of the first exemplary semiconductor structure along the vertical plane D-D' of FIG. 6A.
Figure 9B:
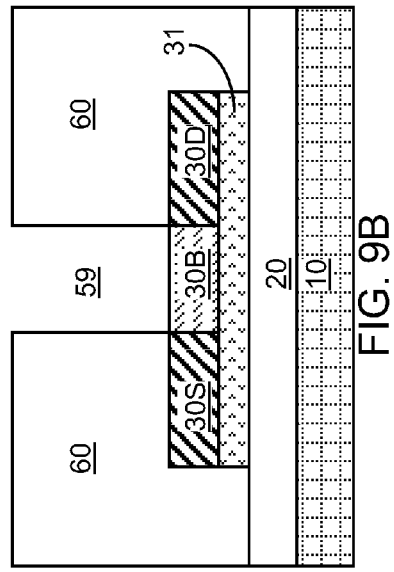
FIG. 9B is a vertical cross-sectional view of the second exemplary semiconductor structure along the vertical plane B-B' of FIG. 9A.
Figure 9D:
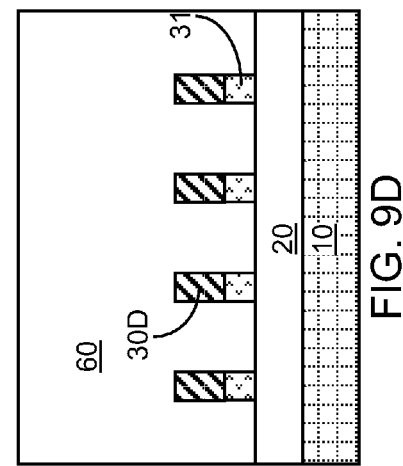
FIG. 9D is a vertical cross-sectional view of the second exemplary semiconductor structure along the vertical plane D-D' of FIG. 9A.
Figure 9A:
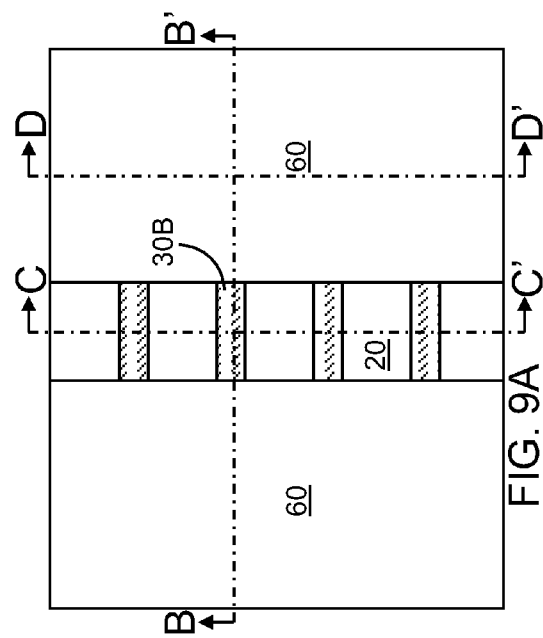
FIG. 9A is a top-down view of the first exemplary semiconductor structure after formation of a planarization dielectric layer and removal of the disposable gate structure to form a gate cavity according to the second embodiment of the present disclosure.
Figure 9C:
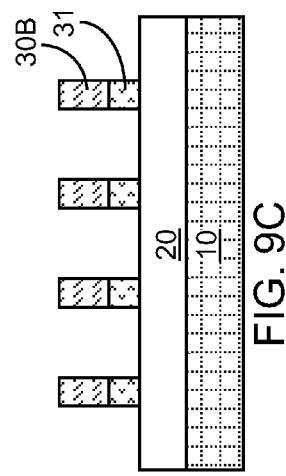
FIG. 9C is a vertical cross-sectional view of the second exemplary semiconductor structure along the vertical plane C-C' of FIG. 9A.

As stated above, the present disclosure relates to field effect transistors employing an epitaxially grown cap layer and a method of manufacturing the same. Aspects of the present disclosure are now described in detail with accompanying figures. It is noted that like reference numerals refer to like elements across different embodiments. The drawings are not necessarily drawn to scale. As used herein, ordinals such as "first" and "second" are employed merely to distinguish similar elements, and different ordinals may be employed to designate a same element in the specification and/or claims.

Referring to FIGS. 1A, 1B, 1C, and 1D, a first exemplary semiconductor structure according to a first embodiment of the present disclosure includes a plurality of semiconductor fins 30 formed on a substrate (10, 20). The plurality of semiconductor fins 30 can be formed, for example, by providing a semiconductor-on-insulator (SOI) substrate including a stack, from bottom to top, of a handle substrate 10, a buried insulator layer 20, and a top semiconductor layer, and by patterning the top semiconductor layer into the plurality of semiconductor fins 30.

The handle substrate 10 can include a semiconductor material, a conductive material, and/or a dielectric material. The handle substrate 10 provides mechanical support to the buried insulator layer 20 and the plurality of semiconductor fins 30. The thickness of the handle substrate 10 can be from 30 microns to 2 mm, although lesser and greater thicknesses can also be employed.

The insulator layer 20 includes an insulator material. As used herein, an insulator material refers to a material having a resistivity greater than $3 \times 10^3$ Ohm-cm. The insulator layer 20 can include a dielectric material such as silicon oxide, silicon nitride, silicon oxynitride, sapphire, or a combination thereof, or can include an intrinsic semiconductor material such as intrinsic InP or intrinsic Si, or a doped insulating semiconductor material such as doped insulating InP or doped insulating GaAs. The thickness of the buried insulator layer 20 can be from 50 nm to 5 microns, although lesser and greater thicknesses can also be employed. In one embodiment, the insulator layer 20 and the handle substrate 10 can be a single contiguous structure including a same insulator material, i.e., the handle substrate 10 and the insulator layer 20 can be merged into a single insulating layer including a same insulating material.

The top semiconductor layer as provided within the SOI substrate can be a semiconductor material layer including a first semiconductor material. As used herein, a "semiconductor material" refers to a material that can have a resistivity less than $3 \times 10^3$ Ohm-cm upon suitable doping. The first semiconductor material can be an elemental semiconductor material or a compound semiconductor material. In one embodiment, the first semiconductor material can be a III-V compound semiconductor material. The semiconductor material may be doped or unintentionally doped with p-type dopants and/or n-type dopants. The semiconductor material can be a single crystalline semiconductor material, a polycrystalline semiconductor material, or an amorphous semiconductor material. The thickness of the top semiconductor layer can be from 10 nm to 500 nm, although lesser and greater thicknesses can also be employed. In one embodiment, the first semiconductor material can be a single crystalline III-V compound semiconductor material. In one embodiment, the first semiconductor material can be single crystalline InGaAs.

The top semiconductor layer can be patterned, for example, by applying a photoresist layer, lithographically patterning the photoresist layer, and transferring the pattern in the photoresist layer into the top semiconductor layer by an anisotropic etch such as a reactive ion etch. The remaining portions of the top semiconductor layer constitute the plurality of semiconductor fins 30. The photoresist layer is subsequently removed, for example, by ashing.

As used herein, a "semiconductor fin" refers to a contiguous structure including a semiconductor material and including a pair of substantially vertical sidewalls that are parallel to each other. As used herein, a surface is "substantially vertical" if there exists a vertical plane from which the surface does not deviate by more than three times the root mean square roughness of the surface. In one embodiment, each semiconductor fin 30 can laterally extend along a lengthwise direction. As used herein, a lengthwise direction of a structure refers to the direction along which the moment of inertia of the structure becomes a minimum.

While the present disclosure is illustrated with a plurality of semiconductor fins 30, embodiments in which a single semiconductor fin 30 is employed in lieu of a plurality of semiconductor fins 30 are expressly contemplated herein.

In one embodiment, the first semiconductor material of the plurality of semiconductor fins 30 can be in contact with a top surface of the substrate (10, 20), and can be a III-V compound semiconductor material, which is herein referred to as a first III-V compound semiconductor material. In one embodiment, the first III-V compound semiconductor material can be a single crystalline compound semiconductor material.

Referring to FIGS. 2A-2D, a disposable gate structure 44 straddling the plurality of semiconductor fins 30 can be formed. The disposable gate structure can be formed, for example, by depositing a disposable gate material layer and patterning the disposable gate material layer using lithography and anisotropic etch. A remaining portion of the disposable gate material layer after the lithographic patterning constitutes the disposable gate structure 44.

The disposable gate material layer includes at least one material that can be removed selective to the first semiconductor material and the material of the insulator layer 20. In this case, the disposable gate material layer can include a dielectric material, a semiconductor material, and/or a metallic material. For example, the disposable gate material layer, and consequently, the disposable gate structure 44, can include germanium, a silicon germanium alloy, silicon nitride, silicon oxynitride, organosilicate glass, an elemental metal, an intermetallic alloy, a metallic nitride, a metallic carbide, or combinations thereof. The disposable gate material layer can be deposited, for example, by chemical vapor deposition (CVD). The height of the disposable gate structure 44, as measured above a topmost surface of the semiconductor fins 30, can be from 50 nm to 600 nm, although lesser and greater thicknesses can also be employed. The disposable gate material layer is subsequently patterned to form the disposable gate structure 44. The patterning of the disposable gate material layer can be performed, for example, by applying and lithographically patterning a photoresist layer over the disposable gate material layer, transferring the pattern in the photoresist layer into the disposable gate material layer by an anisotropic etch, and removing the patterned photoresist layer, for example, by ashing.

Dopant atoms can be implanted into the plurality of semiconductor fins 30 employing the disposable gate structure 44 as an implantation mask. P-type dopants or n-type dopants can be introduced into portions of the plurality of semiconductor fins 30 that are not covered by the disposable gate structure 44. The implanted portions of the plurality of semiconductor fins 30 constitute source regions 30S and drain regions 30D. The unimplanted portions of the plurality of semiconductor fins 30 constitute body regions 30B of a field effect transistor to be subsequently formed.

In one embodiment, the body regions 30B can have a doping of a first conductivity type, and the implanted dopants can have a doping of a second conductivity type that is the opposite of the first conductivity type. For example, the first conductivity type can be p-type and the second conductivity type can be n-type, or vice versa. In this case, the source regions 30S and the drain regions 30D can have a doping of the second conductivity type. The disposable gate structure 44 functions as a self-aligned implantation mask for the purpose of the ion implantation process. Each semiconductor fin (30S, 30D, 30B) includes the first semiconductor material, and as such, each semiconductor fin (30S, 30D, 30B) is a first semiconductor material portion, i.e., a region including a first semiconductor material.

Referring to FIGS. 3A-3D, a planarization dielectric layer 60 is deposited over the plurality of semiconductor fins (30S, 30D, 30B), the insulator layer 20, and the disposable gate structure 44. The planarization dielectric layer 60 includes a dielectric material such as silicon oxide, silicon nitride, silicon oxynitride, organosilicate glass, or combinations thereof. The planarization dielectric layer 60 includes a different material than the material of the disposable gate structure 44. The planarization dielectric layer 60 is subsequently planarized to a height at which a top surface of the disposable gate structure 44 becomes physically exposed. The planarization of the planarization dielectric layer 60 can be performed, for example, by chemical mechanical planarization (CMP). In one embodiment, the disposable gate structure 44 can be employed as a stopping structure for the planarization process. After the planarization process, the top surface of the planarization dielectric layer 60 can be coplanar with a top surface of the disposable gate structure 44. As used herein, a first surface is coplanar with a second surface if a two-dimensional Euclidean plane exists that coincide with the first surface and the second surface.

Subsequently, the disposable gate structure 44 is removed selective to the materials of the planarization dielectric layer 60 and the plurality of semiconductor fins 30. In one embodiment, the disposable gate structure 44 can be removed selective to the material of the insulator layer 20. As used herein, a removal process that removes a first material is "selective" to a second material if the removal process does not remove the second material at a removal rate greater than 1% of the removal rate of the first material. The cavity that is formed by removal of the disposable gate structure 44 is herein referred to as a gate cavity 59. After the removal of the disposable gate structure 44, top surfaces and sidewall surfaces of the body regions 30B of the plurality of semiconductor fins (30S, 30D, 30B) are physically exposed within the gate cavity 59.

Referring to FIGS. 4A-4D, cap layers 34 are formed directly on physically exposed surfaces of the plurality of semiconductor fins (30S, 30D, 30B) within the gate cavity 59. Because the physically exposed surfaces of the plurality of semiconductor fins (30S, 30D, 30B) within the gate cavity 59 are top surfaces and sidewall surfaces of the body regions 30B, the cap layers 34 are formed directly on the top surfaces and sidewall surfaces of the body regions 30B. The cap layers 34 can have a resistivity greater than $3 \times 10^3$ Ohm-cm, and thus, can be epitaxial insulator layers. The atoms within the cap layers 34 can be in epitaxial alignment with the underlying semiconductor material of the semiconductor fins (30S, 30D, 30B). Each cap layer 34 can include a pair of vertical portions having a uniform lateral thickness and joined to each other by a horizontal portion having a uniform vertical thickness, and can contact the top surface of the insulator layer.

In one embodiment, the cap layers 34 can be formed by selective epitaxy of a second semiconductor material that is different from the first semiconductor material. In one embodiment, the first semiconductor material can be a first III-V compound semiconductor material, and the second semiconductor material can be a second III-V compound semiconductor material. In one embodiment, the first semiconductor material is single crystalline, and the second semiconductor material is single crystalline and is epitaxially aligned to the first semiconductor material. When the second semiconductor material is said to be epitaxially aligned to the first semiconductor material, it is meant that the second semiconductor material assumes the same crystallographic structure and order as that of the first semiconductor material. The second semiconductor may be latticed matched to the first semiconductor or may be lattice-mismatched (strained) if the bulk lattice constant of the second semiconductor is bigger or smaller than the lattice constant of the first semiconductor material.

Since the cap layer 34 and the plurality of semiconductor fins (30S, 30D, 30B) are of comparable thicknesses, a strained cap layer 34 can induce strain in an underlying semiconductor fin (30S, 30D, 30B). For example, when the fin width is 5 nm and a cap layer of 1 nm thick is deposited on both sidewalls of a semiconductor fin (30S, 30D, 30B), the fin to cap layer thickness ratio, i.e., the ratio of the lateral thickness of the semiconductor fin (30S, 30D, 30B) to the total thickness of the cap layer 34, is 5:2. Since the semiconductor fin (30S, 30D, 30B) is freestanding (only attached at the bottom), a compressive cap layer 34 would induce tensile strain in the underlying semiconductor fin (30S, 30D, 30B). Similarly, a tensile cap layer 34 would induce compressive strain in an underlying semiconductor fin 34. The amount of strain transfer is mostly dictated by the fin to cap layer thickness ratio. The strain induced in the semiconductor fin (30S, 30D, 30B) can be used to enhance the carrier mobility when the semiconductor fin is used as the device channel, i.e., the channel of a fin field effect transistor. In general, each cap layer 34 can have a first type strain, and each underlying semiconductor fin (30S, 30D, 30B) can have a second type strain that is the opposite of the first type strain. The first type strain and the second type strain include a compressive strain and a tensile strain. Thus, if the cap layer 34 has a compressive strain, the underlying semiconductor fin (30S, 30D, 30B) can have a tensile strain, and vice versa.

The selective epitaxy process deposits the second semiconductor material only on semiconductor surfaces and does not deposit any second semiconductor material on dielectric surfaces. Thus, if the insulator layer 20 includes a dielectric material such as silicon oxide, silicon nitride, silicon oxynitride, or sapphire, the second semiconductor material does not grow from the surfaces of the insulator layer 20 or the surfaces of the planarization dielectric layer 60, but grows from the physically exposed semiconductor surfaces of the plurality of semiconductor fins (30S, 30D, 30B).

The selective epitaxy process can be performed by concurrently or alternately flowing at least one reactant gas and at least one etchant gas. The at least one reactant gas is at least one precursor gas for depositing the second semiconductor material, and the at least one etchant gas is at least one gas that etches a deposited second semiconductor material. If the at least one etchant gas were not present, the growth rate of a single crystalline semiconductor material or a polycrystalline semiconductor material would be greater than the growth rate of an amorphous semiconductor material under a same deposition condition, and the second semiconductor material would grow faster on the surfaces of the body regions 30B than on the surfaces of the insulator layer 20 and the planarization dielectric layer 60. Flowing the at least one etchant gas provides etching of the deposited semiconductor material in the selective epitaxy process. By setting the etch rate of the at least one etchant gas to be between the deposition rate of a crystalline second semiconductor material and the deposition rate of an amorphous second semiconductor material, only crystalline second semiconductor material can be deposited on the surfaces of the body regions 30B in the selective epitaxy process. The thickness of the cap layers 34 can be the same throughout the entirety of the cap layers 34, and can be in a range from 1 nm to 30 nm, although lesser and greater thicknesses can also be employed.

For example, if the semiconductor fins 30 include silicon, and are capped with a cap layer 34 including a silicon-germanium alloy, silane ($SiH_4$) and Germane ($GeH_4$) can be used as the reactant gas and hydrogen chloride (HCl) is used as the etchant gas. The reactant gas may include the etchant component. For example, silicon tetrachloride ($SiCl_4$) can be used to supply both silicon and chlorine which acts as the etchant. Some reactant gases exhibit the needed deposition selectivity without the use of an etchant component. For example, $GeH_4$ will not deposit germanium on $SiO_2$. In yet another example, many metal-organic precursors that are used in the growth of InGaAs/InP material system will not deposit on $SiO_2$ and $Si_3N_4$ surfaces. Examples of metal-organic precursors are TMI, trimethylgallium (TMG), and triethylgallium (TEG).

Upon formation of the cap layers 34 by the selective epitaxy process, the cap layers 34 contact the substrate (10, 20). The first semiconductor material of the body regions 30B is in contact with a top surface of the substrate (10, 20). In one embodiment, the first semiconductor material of the plurality of semiconductor fins (30S, 30D, 30B) can be a first III-V compound semiconductor material, and the cap layers 34 can include a second III-V compound semiconductor material. In one embodiment, the first and second III-V compound semiconductor materials can be selected such that the second III-V compound semiconductor material provides a lower interfacial defect density at an interface with a dielectric material of a gate dielectric layer to be subsequently formed than the first III-V compound semiconductor material. In one embodiment, the first III-V compound semiconductor material can be $In_{0.53}Ga_{0.47}As$, and the second III-V compound semiconductor material can be InP. In yet another embodiment the first III-V compound semiconductor material can be $In_{0.53}Ga_{0.47}As$, and the second III-V compound semiconductor material can be InAlAs. It is noted that InP is latticed matched to $In_{0.53}Ga_{0.47}As$, so no strain is induced in the InGaAs fins 30. To induce strain, $Ga_xIn_{1-x}P$ can be used as the cap layer 34. The thickness of the $Ga_xIn_{1-x}P$ cap layer should be kept below the critical thickness where dislocation forms to relief the strain.

Referring to FIGS. 5A-5D, a gate dielectric layer 50 and a gate electrode 52 are formed within the gate cavity 59. The gate dielectric layer 50 includes a dielectric material such as silicon oxide, silicon nitride, silicon oxynitride, or a dielectric metal compound, i.e., a dielectric material including a metal-containing compound. In one embodiment, the gate dielectric layer 50 includes a dielectric metal oxide or a dielectric metal oxynitride such as $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. In one embodiment, the dielectric metal oxide or a dielectric metal oxynitride can have a dielectric constant greater than 8.0. The thickness of the gate dielectric layer 50 can be from 0.6 nm to 10 nm, although lesser and greater thicknesses can also be employed. In one embodiment, the gate dielectric layer 50 can be deposited by methods such as chemical vapor deposition (CVD), physical vapor deposition (PVD), molecular beam deposition (MBD), pulsed laser deposition (PLD), liquid source misted chemical deposition (LSMCD), atomic layer deposition (ALD), etc. In one embodiment, the gate dielectric layer 50 can be formed as a conformal material layer having a uniform thickness throughout.

The gate electrode 52 can be formed by depositing a conductive material on top of the dielectric material layer 50 to fill the gate cavity 59. Excess portions of the conductive material can be removed from above the top surface of the planarization dielectric layer 60, for example, by chemical mechanical planarization. A remaining portion of the deposited conductive material constitutes the gate electrode 52. Portions of the gate dielectric layer 50 overlying the top surface of the planarization dielectric layer 60 may be removed during the planarization process. The top surface of the gate electrode 52 can be coplanar with the top surface of the remaining portions of the planarization dielectric layer 60.

The first exemplary semiconductor structure contains at least one semiconductor fin (30S, 30D, 30B). Each semiconductor fin (30S, 30D, 30B) includes a first semiconductor material, and is located on a substrate (10, 20). Each semiconductor fin (30S, 30D, 30B) includes a source region 30S, a drain region 30D, and a body region 30B laterally contacting the source region 30S and the drain region 30D. The first exemplary semiconductor structure further contains at least one cap layer 34. Each cap layer 34 includes a second semiconductor material and contacts a top surface and a pair of sidewalls of the body region 30B. For each cap layer 34, a horizontal interface between a semiconductor fin (30S, 30D, 30B) and the cap layer 34 is within a same horizontal plane as a top surface of the semiconductor fin (30S, 30D, 30B). The bottom surface of each body region 30B does not contact any surface of the second semiconductor material, and contacts the top surface of the substrate (10, 20).

In one embodiment, a pair of vertical interfaces between each semiconductor fin (30S, 30D, 30B) and the cap layer 34 in contact with the semiconductor fin (30S, 30D, 30B) can be within a pair of vertical planes that are spaced by the width w of the semiconductor fin (30S, 30D, 30B). In one embodiment, each of the first and second semiconductor materials can be single crystalline and epitaxially aligned to each other.

In one embodiment, for each semiconductor fin (30S, 30D, 30B), a dielectric material layer, i.e., the planarization dielectric layer, can be in contact with the source region 30S and the drain region 30D within the semiconductor fin (30S, 30D, 30B). For each semiconductor fin (30S, 30D, 30B), vertical interfaces between the source region 30S and the planarization dielectric layer 60, vertical interfaces between the drain region 30S and the planarization dielectric layer 60, and vertical interfaces between the body region 30S and the channel region are within a pair of vertical planes. For each semiconductor fin (30S, 30D, 30B), a horizontal interface between the source region 30S and the planarization dielectric layer 60 and a horizontal interface between the drain region 30D and the planarization dielectric layer can be within the same horizontal plane as the horizontal interface between the semiconductor fin (30S, 30D, 30B) and the cap layer 34.

In one embodiment, the first semiconductor material can be a first III-V compound semiconductor material, the second semiconductor material can be a second III-V compound semiconductor material. In one embodiment, the second III-V compound semiconductor material can provide a lower interfacial defect density at an interface with the dielectric material of the gate dielectric layer 50 than the defect density that would be provided at an interface between the first III-V compound semiconductor material and the dielectric material of the gate dielectric layer 50 in the absence of the cap layer 34.

Referring to FIGS. 6A-6D, various contact via structures (62, 64) can be formed through the planarization dielectric layer 60. The various contact via structures (62, 64) extend through the planarization dielectric layer 60, and contact the source regions 30S or the drain regions 30D.

Referring to FIGS. 7A-7D, a variation of the first exemplary semiconductor structure is shown. In the variation of the first exemplary semiconductor structure, physically exposed surfaces of the gate electrode 52 does not include any crystalline semiconductor material, and includes at least one metallic material. The variation of the first exemplary semiconductor structure can be derived from the first exemplary semiconductor structure of FIGS. 2A-2D forming an optional gate spacer 56, and by forming a raised source region 36S and a raised drain region 36D concurrently with, prior to, or after formation of source regions 30S and drain regions 30D.

The gate spacer 56 including a dielectric material can be formed on sidewalls of the gate dielectric layer 50 by deposition of a conformal dielectric material layer and an anisotropic etch that removes the horizontal portions of the conformal dielectric material layer and recesses top regions of the vertical portions of the conformal dielectric material layer. The remaining portions of the conformal dielectric material layer constitute the gate spacer 56. The gate spacer 56 can include, for example, silicon oxide, silicon nitride, silicon oxynitride, or combinations thereof.

Ion implantation is an effective and widely used method for doping semiconductors such as silicon (Si) and germanium (Ge). However, for some semiconductors such as InGaAs and InP ion implantation may not be the most effective way to dope the material. It was experimentally observed that post implantation dopant activation has a relatively low yield in these materials. An alternative method for forming heavily doped source regions 30S and drain regions 30D is by use of in-situ doped epitaxy. With this method, doped semiconductor material is added over the exposed portions of fins 30. The doped material is said to be added epitaxially, which means that the added semiconductor material assumes the same crystallographic structure and order as that of the semiconductor fins 30. The plurality of semiconductor fins 30 are therefore being used as a template for the growth of doped semiconductor material that forms the source regions 30S and the drain regions 30D. In one embodiment when enough doped semiconductor material is added to the plurality of semiconductor fins 30, the plurality of semiconductor fins 30 will eventually merge.

For example, when the plurality of semiconductor fins 30 are made of InGaAs, additional n-type doped InGaAs can be epitaxially added to the plurality of semiconductor fins 30. The addition (growth) of doped InGaAs can be done using methods such as metal-organic chemical vapor deposition (MOCVD), or metal-organic molecular beam epitaxy (MO-MBE). These deposition methods provide selective growth in the sense that InGaAs is added only over the plurality of semiconductor fins 30, but is not deposited over other surfaces such as the insulator layer 20 and the disposable gate structure 44. Examples of precursor that are used for MOCVD deposition of InGaAs are triethylgallium (TEG) and trimethylindium (TMI) for group III and arsine ($AsH_3$) for group V. To achieve n-type in-situ doping a precursor such as silicon tetrabromide ($SiBr_4$) is also added to the gas mixture during epitaxy. For p-type doping a precursor such as carbon tetrabromide ($CBr_4$) can be used. We further note that the added doped semiconductor does not need to be identical in composition to that forming the plurality of semiconductor fins 30. Using the above example, doped InAs can be epitaxially added over the semiconductor fins 30 to make the doped source regions 30S and the drain regions 30D.

In this case, the raised source region 36S and the raised drain region 36D can be formed, for example, by selective deposition of a semiconductor material. During the selective deposition, at least one reactant including a semiconductor precursor material and at least one etchant are concurrently or alternately flowed into a process chamber including the variation of the first exemplary semiconductor structure so that the semiconductor material is deposited on the semiconductor surfaces of the semiconductor fins (30S, 30D, 30B) without nucleating the semiconductor material on dielectric surfaces such as the surfaces of the gate dielectric layer 50, the insulator layer 20, or on the metallic surfaces of the gate electrode 52. In one embodiment, the selective deposition can be selective epitaxy, and the raised source region 36S and the raised drain region 36D can include a single crystalline semiconductor material. When in-situ doped epitaxy is used to define the source regions 30S and the drain regions 30D, the disposable gate structure 44 blocks the deposition of doped semiconductor material over the channel region.

The semiconductor material of the raised source region 36S and the raised drain region 36D can be deposited with in-situ doping with dopants of a conductivity type, which can be p-type or n-type. The conductivity type of the raised source region 36S and the raised drain region 36D can be the same as the conductivity type of the source regions 30S and the drain regions 30D. Alternately, the semiconductor material of the raised source region 36S and the raised drain region 36D can be deposited as an intrinsic semiconductor material and subsequently doped with dopants. In one embodiment, each of the raised source region 36S and the raised drain region 36D can be formed by merging of multiple deposited semiconductor portions as the thickness of the deposited semiconductor material exceeds one half of the spacing between adjacent pairs of semiconductor fins (30S, 30D, 30B).

The raised source region 36S is in contact with a top surface and sidewall surfaces of each source region 30S. The raised drain region 36D is in contact with a top surface and sidewall surfaces of each drain region 30D. For each semiconductor fin (30S, 30D, 30B), vertical interfaces between the source region 30S and the raised source region 36S, vertical interfaces between the drain region 30D and the raised drain region 36D, and vertical interfaces between the body region 30B and the cap layer 34 in contact with the semiconductor fin (30S, 30D, 30B) can be within a pair of vertical planes. Further, for each semiconductor fin (30S, 30D, 30B), a horizontal interface between the source region 30S and the raised source region 36S and a horizontal interface between the drain region 30D and the raised drain region 36D can be within the same horizontal plane as the horizontal interface between the semiconductor fin (30S, 30D, 30B) and the cap layer 34.

The processing steps of FIGS. 3A-3D, 4A-4D, 5A-5D, and 6A-6D can be subsequently performed to provide the variation of the first exemplary semiconductor structure illustrated in FIGS. 7A-7D. The contact level dielectric layer 80 can be deposited over the raised source region 36S and the raised drain region 36D, and planarized employing the gate electrode 52 as a stopping structure. Various contact via structures (62, 64) can be subsequently formed through the contact level dielectric layer 80, which is a dielectric material layer including a dielectric material such as silicon oxide, silicon nitride, silicon oxynitride, and/or organosilicate glass.

Referring to FIGS. 8A-8D, a second exemplary semiconductor structure according to a second embodiment of the present disclosure includes a plurality of semiconductor fins 30'. Each semiconductor fin 30' can be located on a buffer material portion 31. In one embodiment, each vertical stack of a semiconductor fin 30' and a buffer material portion 31 can have the same width w throughout the entirety thereof. The semiconductor fins 30' include a first semiconductor material, which can be the same as in the first embodiment.

The buffer material portions 31 include a material that is different from the first semiconductor material. For example, the buffer material portions 31 can include a material that can be removed selective to the first semiconductor material in an etch process. The buffer material portions 31 can include a semiconductor material or an insulator material. The buffer material does not need to be a semiconductor. In one embodiment, the buffer material portions 31 can be provided by use of bonded wafers. In this case, the buffer material could be any material that can be selectively etched with respect to the semiconductor material of the semiconductor fins 30'. In one embodiment, the buffer material portions 31 can include InP and the semiconductor fins 30' can include InGaAs.

The height of the buffer material portions 31 can be in a range from 5 nm to 20 nm, and the height of the semiconductor fins 30' can be in a range from 5 nm to 40 nm, although lesser and greater heights can be employed for the buffer material portions 31 and the semiconductor fins 30'.

In one embodiment, the stacks of the semiconductor fins 30' and the buffer material portions 31 can be formed, for example, by providing a vertical stack of buffer semiconductor material layer and a first semiconductor material layer on the substrate (10, 20), and by patterning the vertical stack of buffer semiconductor material layer and the first semiconductor material layer by a combination of a lithographic patterning processes and an anisotropic etch process.

The semiconductor fins 30' can have a doping of a first conductivity type, or can be intrinsic. If the buffer material portions 31 includes a semiconductor material, the buffer material portions 31 can be intrinsic, or can be doped with dopants. If both of the semiconductor fins 30' and the buffer material portions 31 are doped, the buffer material portions 31 are doped with dopants of a second conductivity type, which is the opposite of the first conductivity type. In one embodiment, the semiconductor fins 30' can include intrinsic or p-doped InGaAs, and the buffer material portions 31 can include n-doped InP.

Referring to FIGS. 9A-9D, the processing steps of FIGS. 2A-2D and FIGS. 3A-3D are sequentially performed to form source regions 30S, drain regions 30D, body regions 30B, and a gate cavity 59.

In one embodiment, the body regions 30B can have a doping of a first conductivity type, and the implanted dopants can have a doping of a second conductivity type that is the opposite of the first conductivity type. For example, the first conductivity type can be p-type and the second conductivity type can be n-type, or vice versa. In this case, the source regions 30S and the drain regions 30D can have a doping of the second conductivity type. Each semiconductor fin (30S, 30D, 30B, 31) includes a vertical stack, from bottom to top, of a buffer material portion 31 and a first semiconductor material portion (30S, 30D, 30B) containing the first semiconductor material.

Referring to FIGS. 10A-10D, a physically exposed portion of each buffer material portion 31 is removed by an isotropic etch that is selective to the first semiconductor material of the first semiconductor material portions (30S, 30D, 30B) and the dielectric material of the planarization dielectric layer 60. The isotropic etch can be a wet etch or a dry etch. The gate cavity 59 is laterally expanded by the isotropic etch, and a physically exposed portion of each first semiconductor material portion (30S, 30D, 30B) becomes suspended within the gate cavity 59. Remaining portions of the buffer material portions 31 are herein referred to as source-side buffer material portions 31S and drain-side buffer material portions 31D.

Figure 10B:
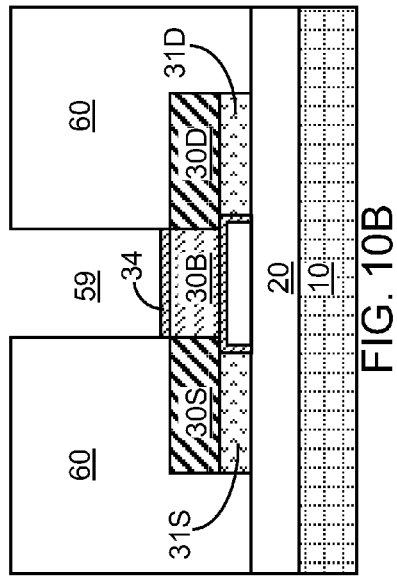
FIG. 10B is a vertical cross-sectional view of the second exemplary semiconductor structure along the vertical plane B-B' of FIG. 10A.
Figure 10D:
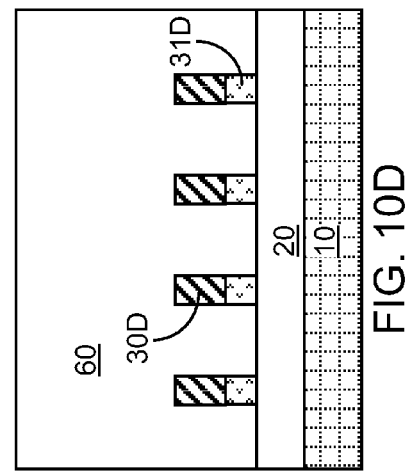
FIG. 10D is a vertical cross-sectional view of the second exemplary semiconductor structure along the vertical plane D-D' of FIG. 10A.
Figure 10A:
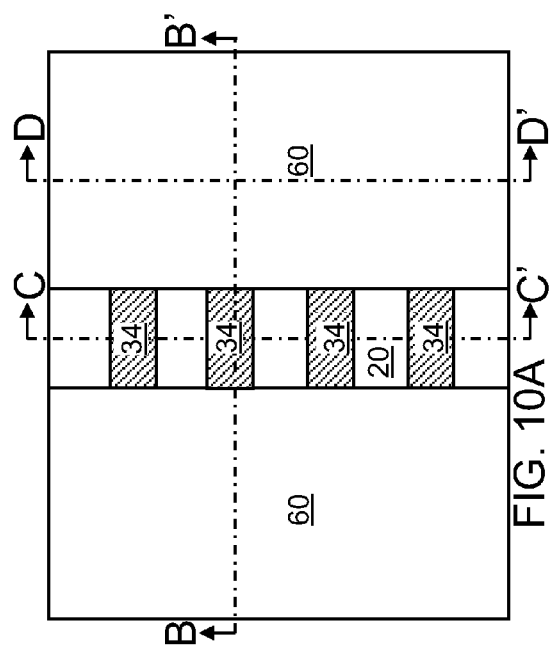
FIG. 10A is a top-down view of the second exemplary semiconductor structure after formation of cap layers according to the second embodiment of the present disclosure.
Figure 10C:
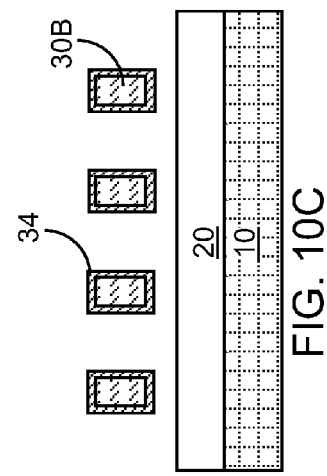
FIG. 10C is a vertical cross-sectional view of the second exemplary semiconductor structure along the vertical plane C-C' of FIG. 10A.
Figure 11A:
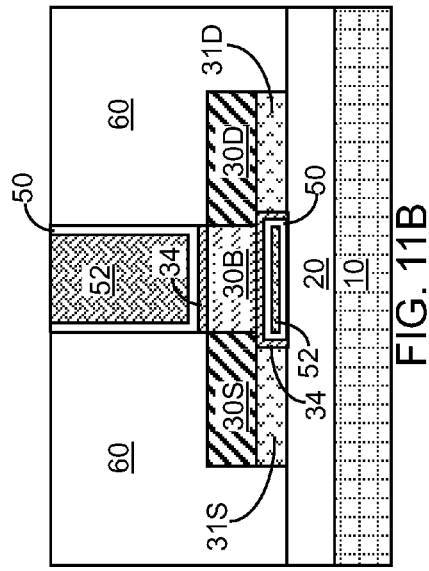
FIG. 11A is a top-down view of the second exemplary semiconductor structure after formation of a gate dielectric layer and a gate electrode according to the second embodiment of the present disclosure.
Figure 11B:
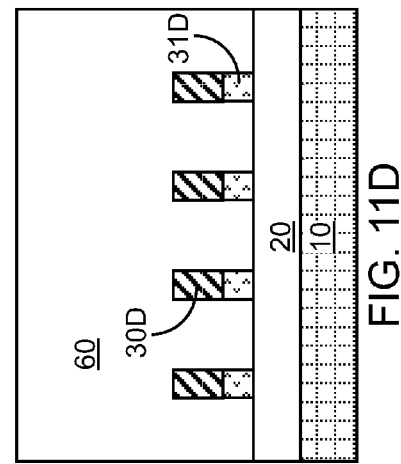
FIG. 11B is a vertical cross-sectional view of the second exemplary semiconductor structure along the vertical plane B-B' of FIG. 11A.
Figure 11C:
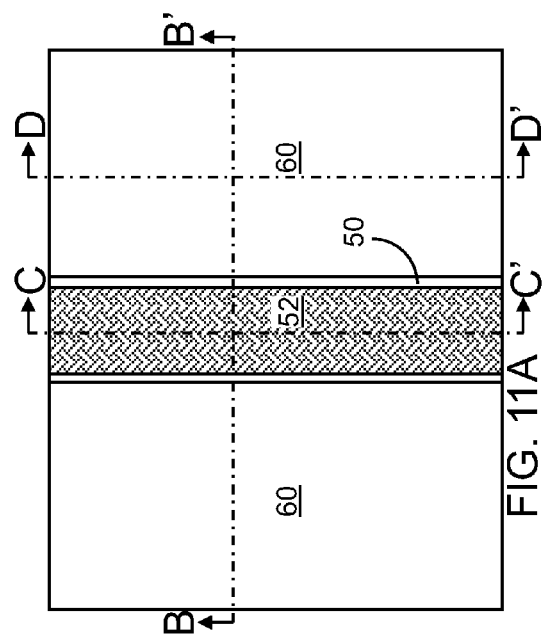
FIG. 11C is a vertical cross-sectional view of the second exemplary semiconductor structure along the vertical plane C-C' of FIG. 11A.
Figure 11D:
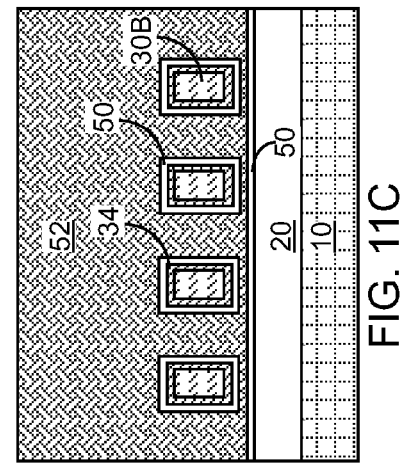
FIG. 11D is a vertical cross-sectional view of the second exemplary semiconductor structure along the vertical plane D-D' of FIG. 11A.

In one embodiment, the buffer material portions 31 can be removed by a crystallographic-orientation dependent etch, which provides different etch rates for different crystallographic orientations. The use of a crystallographic-orientation dependent etch can minimize the undesirable sideway etch that encroaches into the regions 31S and 31D as shown in FIG. 10B. A crystallographic-orientation dependent etch has the characteristic of having different etching rates for different crystallographic orientations. For example if the top surface of the insulator layer 20 is a (101) plane and if the semiconductor fins 30' are defined to have sidewalls parallel to the (10$\bar{1}$) and ($\bar{1}$01) planes, the sidewalls of the source-side buffer material portions 31S and the drain-side buffer material portions 31D that are perpendicular to the lengthwise direction of the semiconductor fins 30' are parallel to the (010) plane and the (0$\bar{1}$0) plane. To suspend a center portion of each semiconductor fin 30', a crystallographic-orientation dependent etch with a high etching rate along the <110> directions and a slow etching rate along the <100> planes direction may be used. This would allow the removal of the buffer material portion 31 with little encroachment into the source-side buffer material portions 31S and the drain-side buffer material portions 31D.

Cap layers 34 are formed directly on physically exposed surfaces of the plurality of semiconductor fins (30S, 30D, 30B, 31S, 31D) within the gate cavity 59. The cap layers 34 are formed directly on the top surfaces, sidewall surfaces, and the bottom surfaces of the body regions 30B and sidewall surfaces of the source-side buffer material portions 31S and the drain-side buffer material portions 31D. The cap layers 34 can have a resistivity greater than $3 \times 10^3$ Ohm-cm, and thus, can be epitaxial insulator layers. The atoms within the cap layers 34 can be in epitaxial alignment with the underlying semiconductor material of the semiconductor fins (30S, 30D, 30B, 31S, 31D).

As in embodiments discussed earlier, the cap layers 34 can be formed by selective epitaxy of a second semiconductor material that is different from the first semiconductor material. In one embodiment, the first semiconductor material can be a first III-V compound semiconductor material, and the second semiconductor material can be a second III-V compound semiconductor material. In one embodiment, the first semiconductor material is single crystalline, and the second semiconductor material is single crystalline and is epitaxially aligned to the first semiconductor material. The cap layers 34 have the compositional and structural properties as in the first embodiment.

In particular, since the cap layer 34 and the plurality of semiconductor fins (30S, 30D, 30B) are of comparable thicknesses, a strained cap layer 34 can induce strain in an underlying semiconductor fin (30S, 30D, 30B). For example, when the fin width is 5 nm and a cap layer of 1 nm thick is deposited on both sidewalls of a semiconductor fin (30S, 30D, 30B), the fin to cap layer thickness ratio, i.e., the ratio of the lateral thickness of the semiconductor fin (30S, 30D, 30B) to the total thickness of the cap layer 34, is 5:2. Since the semiconductor fin (30S, 30D, 30B) is freestanding (only attached at the bottom), a compressive cap layer 34 would induce tensile strain in the underlying semiconductor fin (30S, 30D, 30B). Similarly, a tensile cap layer 34 would induce compressive strain in an underlying semiconductor fin 34. The amount of strain transfer is mostly dictated by the fin to cap layer thickness ratio. The strain induced in the semiconductor fin (30S, 30D, 30B) can be used to enhance the carrier mobility when the semiconductor fin is used as the device channel, i.e., the channel of a fin field effect transistor. In general, each cap layer 34 can have a first type strain, and each underlying semiconductor fin (30S, 30D, 30B) can have a second type strain that is the opposite of the first type strain. The first type strain and the second type strain include a compressive strain and a tensile strain. Thus, if the cap layer 34 has a compressive strain, the underlying semiconductor fin (30S, 30D, 30B) can have a tensile strain, and vice versa.

The selective epitaxy process deposits the second semiconductor material only on semiconductor surfaces and does not deposit any second semiconductor material on dielectric surfaces. Thus, if the insulator layer 20 includes a dielectric material such as silicon oxide, silicon nitride, silicon oxynitride, or sapphire, the second semiconductor material does not grow from the surfaces of the insulator layer 20 or the surfaces of the planarization dielectric layer 60, but grows from the physically exposed semiconductor surfaces of the plurality of semiconductor fins (30S, 30D, 30B, 31S, 31D). The same selective epitaxy process can be employed as in the first embodiment.

Upon formation of the cap layers 34 by the selective epitaxy process, the cap layers 34 contact the substrate (10, 20). Each bottom surface of the body region 30B can contacts a surface of a cap layer 34. In one embodiment, the first semiconductor material portion (30S, 30D, 30B) can be a first III-V compound semiconductor material, and the cap layers 34 can include a second III-V compound semiconductor material. In one embodiment, the first and second III-V compound semiconductor materials can be selected such that the second III-V compound semiconductor material provides a lower interfacial defect density at an interface with a dielectric material of a gate dielectric layer to be subsequently formed than the first III-V compound semiconductor material. In one embodiment, the first III-V compound semiconductor material can be InGaAs, and the second III-V compound semiconductor material can be InP.

Referring to FIGS. 11A-11D, a gate dielectric layer 50 and a gate electrode 52 are sequentially formed in the gate cavity 59 employing the same method as in the first embodiment. The gate electrode 52 laterally surrounds each suspended portion of the first semiconductor material, i.e., each body region 30B, and each cap layer 34. Subsequently, the processing steps of FIGS. 6A-6D or the processing steps of FIGS. 7A-7D can be performed. It is noted that a device where the suspended fin channel is surrounded by the gate stack (gate dielectric layer 50 and a gate electrode 52) is also referred to as a gate-all-around (GAA) field effect transistor (FET).

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
   a semiconductor fin comprising a first semiconductor material, said semiconductor fin comprising a source region located on a source-side buffer material portion that is in contact with a portion of a substrate, a drain region located on a drain-side buffer material portion that is in contact with another portion of said substrate, and a body region laterally contacting said source region and said drain region and vertically spaced from said substrate; and
   a cap layer comprising a second semiconductor material and contacting a top surface, a bottom surface and a pair of sidewalls of said body region, a sidewall of said source-side buffer material region and a sidewall of said drain-side buffer material region, wherein a horizontal interface between said source region and said source-side buffer material portion, a horizontal interface between said drain region, and said drain-side buffer material portion and a horizontal interface between said bottom surface of said body region and said cap layer are within a same horizontal plane.

2. The semiconductor structure of claim 1, wherein a pair of vertical interfaces between said semiconductor fin and said cap layer are within a pair of vertical planes spaced by a width of said semiconductor fin.

3. The semiconductor structure of claim 1, wherein each of said first and second semiconductor materials is single crystalline and epitaxially aligned to each other.

4. The semiconductor structure of claim 1, further comprising a dielectric material layer in contact with said source region, said drain region, said source-side buffer material portion, and said drain-side buffer material portion, wherein vertical interfaces between said source region and said dielectric material layer, vertical interfaces between said drain region and said dielectric material layer, vertical interfaces between said source-side buffer material portion and said dielectric material layer, vertical interfaces between said drain-side buffer material portion and said dielectric material layer, and vertical interfaces between said body region and said cap layer are within a pair of vertical planes.

5. The semiconductor structure of claim 1, further comprising:
   a raised source region in contact with a top surface and sidewall surfaces of said source region and sidewall surface of said source-side buffer material portion; and
   a raised drain region in contact with a top surface and sidewalls of said drain region and sidewall surface of said drain-side buffer material portion, wherein a horizontal interface between said source region and said raised source region and a horizontal interface between said drain region and said raised drain region are within said same horizontal plane.

6. The semiconductor structure of claim 4, wherein a horizontal interface between said source region and said dielectric material layer and a horizontal interface between said drain region and said dielectric material layer are within said same horizontal plane.

7. The semiconductor structure of claim 1, wherein said cap layer has a first type strain, and said semiconductor fin has second type strain that is the opposite of said first type strain, and said first type strain and said second type strain include a compressive strain and a tensile strain.

8. The semiconductor structure of claim 1, wherein said semiconductor fin, said source-side buffer material portion, and said drain-side buffer material portion have a same width.

9. The semiconductor structure of claim 1, wherein said body region is vertically spaced from said substrate by a distance that is equal to a height of each of said source-side buffer material portion and said drain-side buffer material portion.

10. The semiconductor structure of claim 1, wherein said source region has a first length and said source-side buffer material portion has a second length less than said first length, and wherein said drain region has a third length and said drain-side buffer material portion has a fourth length less than said third length.

11. The semiconductor structure of claim 10, wherein said cap layer contacts a portion of a bottom surface of said source region and a portion of a bottom surface of said drain region.

12. The semiconductor structure of claim 1, wherein each of said source-side buffer material portion and said drain-side buffer material portion is composed of a third semiconductor material different from said first semiconductor material.

13. The semiconductor structure of claim 12, wherein said body region has a doping of a first conductivity type, and each of said source-side buffer material portion, said drain-side buffer material portion, said source region, and said drain region has a doping of a second conductivity type opposite said first conductivity type.

14. The semiconductor structure of claim 1, further comprising a gate stack comprising a gate dielectric contacting said cap layer and a gate electrode contacting said gate dielectric, wherein said gate stack surrounds said body region of said semiconductor fin.

15. The semiconductor structure of claim 1, wherein the first semiconductor material comprises InGaAs, and the second semiconductor material comprises InP.

* * * * *